(12) United States Patent
Song et al.

(10) Patent No.: US 9,191,474 B2
(45) Date of Patent: Nov. 17, 2015

(54) SHIELDING STRUCTURE FOR USE IN AN ELECTRONIC DEVICE

(71) Applicant: Samsung Electronics Co., Ltd., Gyeonggi-do (KR)

(72) Inventors: Young-Kwang Song, Seoul (KR); Sung-Won Park, Gyeonggi-do (KR); Yong-Lak Cho, Gyeongsangbuk-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 143 days.

(21) Appl. No.: 14/138,220

(22) Filed: Dec. 23, 2013

(65) Prior Publication Data

US 2014/0177186 A1 Jun. 26, 2014

(30) Foreign Application Priority Data

Dec. 21, 2012 (KR) ........................ 10-2012-0151089

(51) Int. Cl.
*H04M 1/02* (2006.01)
*H04B 1/3888* (2015.01)
*H05K 9/00* (2006.01)
*H04M 1/19* (2006.01)

(52) U.S. Cl.
CPC ............ *H04M 1/0277* (2013.01); *H04B 1/3888* (2013.01); *H05K 9/0039* (2013.01); *H04M 1/19* (2013.01)

(58) Field of Classification Search
CPC .... H04M 1/0277; H04M 1/19; H05K 9/0039; H05K 1/0215; H05K 1/0218; H05K 2201/10371; H05K 1/0219; H05K 2201/10386; H04B 1/3888
See application file for complete search history.

(56) References Cited

U.S. PATENT DOCUMENTS

| | | | | |
|---|---|---|---|---|
| 4,737,597 A * | 4/1988 | Tomiya et al. | ................ | 174/376 |
| 5,138,529 A * | 8/1992 | Colton et al. | ................ | 361/816 |
| 5,397,856 A * | 3/1995 | Lee | ............................. | 174/520 |
| 5,537,294 A * | 7/1996 | Siwinski | ....................... | 361/753 |
| 5,563,450 A * | 10/1996 | Bader et al. | ................... | 257/785 |
| 6,140,591 A * | 10/2000 | Osborne et al. | ........... | 174/138 E |
| 6,149,443 A * | 11/2000 | Moran | ............................ | 439/66 |
| 6,424,538 B1 * | 7/2002 | Paquin | ........................... | 361/752 |
| 6,456,504 B1 * | 9/2002 | LoForte et al. | ............... | 361/799 |
| 6,501,030 B1 * | 12/2002 | Parizi et al. | ................... | 174/250 |
| 6,863,547 B2 * | 3/2005 | Park | ............................... | 439/95 |
| 6,937,475 B2 * | 8/2005 | Rigimbal et al. | ............. | 361/752 |
| 7,028,389 B2 * | 4/2006 | Chang | ........................... | 29/739 |
| 7,264,501 B1 * | 9/2007 | Lin | ............................... | 439/571 |
| 7,385,830 B2 * | 6/2008 | Liu et al. | ....................... | 361/810 |
| 8,043,098 B2 * | 10/2011 | Huang | ........................... | 439/95 |

(Continued)

FOREIGN PATENT DOCUMENTS

| KR | 0143360 B1 | 8/1998 |
|---|---|---|
| KR | 10-2010-0020579 A | 2/2010 |
| KR | 10-2011-0073663 A | 6/2011 |

*Primary Examiner* — Adrian S Wilson
*Assistant Examiner* — Abhishek Rathod
(74) *Attorney, Agent, or Firm* — Cha & Reiter, LLC

(57) ABSTRACT

An electronic device is provided including a mainboard having a ground; a conductive bracket coupled to the mainboard; and an elastic member coupled to the mainboard, and electrically connected with the ground of the mainboard; wherein the elastic member is in elastic contact with the conductive bracket; and wherein the elastic member is electrically connected to the conductive bracket.

14 Claims, 15 Drawing Sheets

(56) References Cited

U.S. PATENT DOCUMENTS

| | | | |
|---|---|---|---|
| 8,587,954 B2* | 11/2013 | Hsieh et al. | 361/759 |
| 8,657,242 B2* | 2/2014 | Peng et al. | 248/188.1 |
| 8,779,295 B2* | 7/2014 | Hsieh | 174/138 D |
| 9,017,115 B2* | 4/2015 | Connell | 439/862 |
| 2002/0142632 A1* | 10/2002 | Moore | 439/95 |
| 2004/0081529 A1* | 4/2004 | Stanton et al. | 411/44 |
| 2005/0078460 A1* | 4/2005 | Richard et al. | 361/753 |
| 2007/0052100 A1* | 3/2007 | Bellinger | 257/758 |
| 2009/0295649 A1* | 12/2009 | An et al. | 343/702 |
| 2010/0259914 A1* | 10/2010 | Lee et al. | 361/818 |

* cited by examiner

SHIELDING STRUCTURE FOR USE IN AN ELECTRONIC DEVICE

CLAIM OF PRIORITY

This application claims the benefit of priority under 35 U.S.C. §119(a) from a Korean Patent Application filed in the Korean Intellectual Property Office on Dec. 21, 2012 and assigned Serial No. 10-2012-0151089, the contents of which are herein incorporated by reference.

BACKGROUND

1. Technical Field

The present disclosure relates to an electronic device and more particularly to a shielding structure for use in an electronic device.

2. Description of the Related Art

Mobile communications devices, such as mobile communications terminals (e.g., cellular phones), electronic schedulers, tablet computers, and laptops have become ubiquitous. Such mobile communications devices normally include noise shielding mechanisms to prevent noise from interfering with their operation. For example, FIGS. 1A and 1B depict an electromagnetic shielding apparatus 1 that is known in the art. The electromagnetic shielding apparatus 1 includes a mainboard 11 and an electromagnetic shielding structure 12 laminated and coupled to the mainboard 11. The electromagnetic shielding structure 12 prevents the escape of electromagnetic waves originated from the mainboard 1 as well as the flow of external noises into the mainboard 11.

The electromagnetic shielding structure 12 includes a conductive plate 121, and a conductive rubber gasket 122 attached to the conductive plate 121 and electrically connected with the conductive plate 121. The conductive plate 121 includes a bottom part 1211, and a wall part 1212 protruding at a predetermined height from the bottom part 1211. The conductive rubber gasket 122 is attached to a top of the wall part 1212. The mainboard 11 includes a ground pad 113 which is electrically connected with the ground of the mainboard. The ground pad 113 is formed on a surface of the mainboard 11 on which electronic parts 111 are mounted.

When the mainboard 11 and the electromagnetic shielding structure 12 are coupled with each other, the conductive rubber gasket 122 comes in elastic and electrical contact with the ground pad 113.

In some aspects, the foregoing shielding apparatus may suffer from several disadvantages. For example, due to variations in the shape of the wall part 1212, the electrical contact between the wall part 1212 and the conductive rubber gasket 122 can be disrupted. Similarly, due to variations in the shape of the conductive rubber gasket 122, the electrical contact between the conductive rubber gasket 122 and the ground pad 113 can also be disrupted. Furthermore, the elastic force of the conductive rubber gasket 122 may deteriorate due to aging, which in turn can also result in a disruption of the electrical contact between the conductive rubber gasket 122 and the ground pad 113. And still furthermore, when the conductive rubber gasket 122 is oxidized, the surface resistance of the conductive rubber gasket 122 is increased, thus making more difficult the electrical communication between the conductive rubber gasket 122 and the ground pad 113. As will be readily appreciated, any of the aforementioned disruptions in electrical contact may cause the noise shielding provided by the shielding apparatus to deteriorate.

Accordingly the need exists for improved mechanisms and techniques for noise shielding.

SUMMARY

An aspect of the present invention is to substantially solve at least the above problems and/or disadvantages and to provide at least the advantages below.

Accordingly, one aspect of the present invention is to provide an electronic device capable of performing noise shielding.

Another aspect of the present invention is to provide an electronic device for preventing noise shielding from being deteriorated due to aging or oxidization of a conductive rubber gasket which is arranged between a mainboard and a conductive bracket to send a flow of noise originated from the mainboard to the conductive bracket.

A further aspect of the present invention is to provide an electronic device for stopping noise shielding from being deteriorated due to weakening of an electrical contact force between a conductive rubber gasket and a mainboard or between the conductive rubber gasket and a conductive bracket.

Yet another aspect of the present invention is to provide an electronic device having an elastic member which is arranged between a mainboard and a conductive bracket to send a flow of noise originated from the mainboard to the conductive bracket to reduce the noise, and is mounted on the mainboard.

Still another aspect of the present invention is to provide an electronic device capable of securing a space for part mounting by reducing a size of a ground pad of a mainboard coming in contact with a noise-shielding conductive rubber gasket.

An electronic device is provided comprising a mainboard having a ground; a conductive bracket coupled to the mainboard; and an elastic member coupled to the mainboard, and electrically connected with the ground of the mainboard; wherein the elastic member is in elastic contact with the conductive bracket; and wherein the elastic member is electrically connected to the conductive bracket.

According to another aspect of the disclosure, an electronic device is provided comprising: a front housing; a rear housing coupled to the front housing; a mainboard disposed in a space between the front housing and the rear housing; an elastic member coupled to a ground of the mainboard; a conductive bracket attached to an inner surface of the rear housing; and a conductive flexible gasket disposed between the mainboard and the conductive bracket, wherein the conductive flexible gasket is arranged not to overlap with the elastic member, and wherein the conductive flexible gasket is electrically coupled to the ground of the mainboard and to the conductive bracket, wherein the elastic member comprises a fixing fragment attached to the mainboard, at least one free end formed from the fixing fragment, and a protrusion for preventing the free end from becoming damaged by the conductive bracket.

According to yet another aspect of the disclosure, an electronic device is provided. The device includes a front housing, a rear housing, a rear cover, a mainboard, a conductive bracket, and a conductive rubber gasket. The front housing is arranged in the front of the electronic device. The rear housing is coupled with the front housing, and provides a space of housing a plurality of electronic parts by coupling with the front housing. The rear cover is arranged in the rear of the electronic device, and provides a space of housing a battery by coupling with the rear housing. The mainboard is arranged in a space provided by coupling of the front housing and the rear housing, and mounts an elastic member electrically connected with the ground. The conductive bracket is attached to an inner surface of the rear housing, is laminated on the mainboard, and is electrically connected with the ground of the mainboard due to an elastic contact with the elastic member of the mainboard. The conductive rubber gasket is arranged between the mainboard and the conductive bracket, and sends a flow of noise originated from the mainboard to the conductive bracket. The conductive rubber gasket is arranged not to overlap with the elastic member. The elastic member sends a flow of noise originated from the mainboard to the conductive bracket. The elastic member includes a fixing fragment attached to the mainboard, at least one free end bent and formed from the fixing fragment, protruding from the mainboard, and getting in elastic contact with the conductive bracket in a state being elastically supported from the fixing fragment, and a protrusion protruding from the fixing fragment, and stopping the mainboard and the conductive bracket from getting close less than a predetermined distance.

BRIEF DESCRIPTION OF THE DRAWINGS

The above features and advantages of the present disclosure will become more apparent from the following detailed description when taken in conjunction with the accompanying drawings in which.

DETAILED DESCRIPTION

Figure 1A:
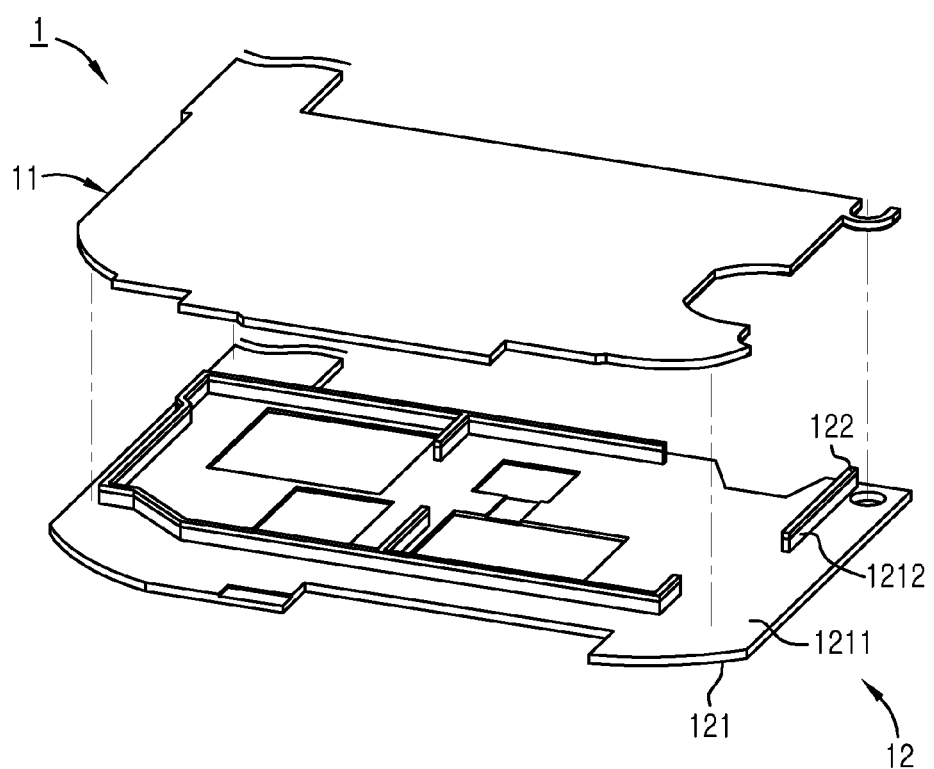
FIG. 1A is an exploded perspective view of an electromagnetic shielding apparatus in the prior art.
Figure 1B:
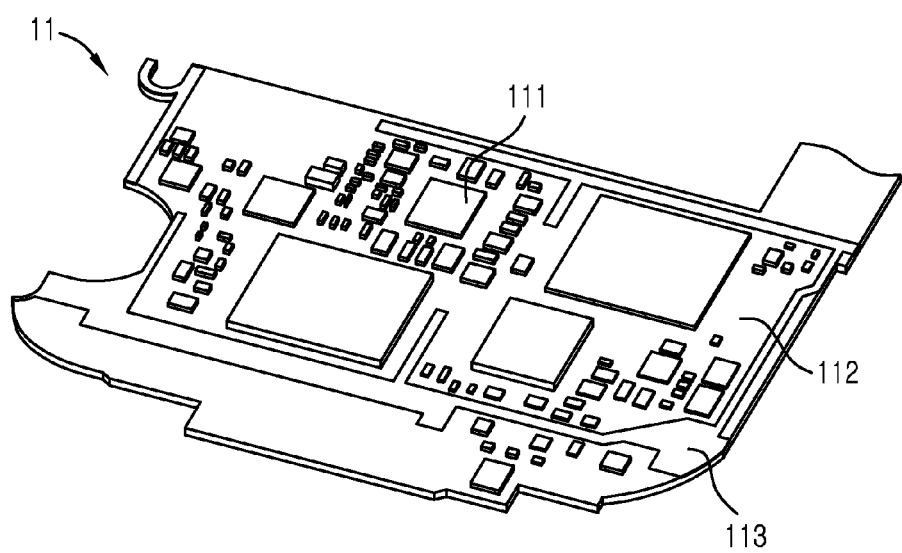
FIG. 1B is a perspective view of a mainboard of an electronic device in the prior art.

Aspects of the present disclosure will be described herein below with reference to the accompanying drawings. In the following description, well-known functions or constructions are not described in detail since they may obscure parts of the disclosure that are considered pertinent. Any terms used throughout the disclosure should be interpreted based on the context of the disclosure.

Referring to FIGS. 2-5, shown is an electronic device 100 which includes a mainboard 130, a speaker 101, a touch screen 103 positioned below the speaker 101, a microphone 105 positioned below the touch screen 103, a keypad 107, a front camera 109, and a rear camera 111. The mainboard 130 includes a substrate base on which various components of the device 100 are mounted. The speaker 101, touch screen 103, microphone 105, keypad 107, and cameras 109 and 111 may be disposed inside a housing 110 of the electronic device 100. The housing 110 includes a front housing 113, a rear housing 115, and a rear cover 114. The touch screen 103 and the mainboard 130 are arranged in a housing space formed by coupling the front housing 113 and the rear housing 115. A battery 140 is housed in a space formed by coupling the rear housing 115 and the rear cover 114. The rear cover 114 is detachable from the rear housing 115. The rear cover 114 can also be referred to as a battery cover.

As noted, the front housing 113 and the rear housing 115 are coupled with each other. The front housing 113 includes a boss 1131 for coupling with the rear housing 115. The boss 1131 includes a screw hole which is coupled with a screw 150. The rear housing 115 includes a boss coupling hole 1151. The screw 150 passes through the boss coupling hole 1151 and through the screw hole of the boss 1131 to couple the front housing 113 and the rear housing 115 with each other. The front housing 113 is arranged in the front of the electronic device 100, and the rear cover 114 is arranged in the rear of the electronic device 100. The rear cover 114 covers the rear housing 115. The front housing 113 and the rear cover 114 are coupled with each other.

The electromagnetic shielding structure 16 may be attached to the rear housing 115 by using a fastener (e.g., a screw), a bonding agent, and/or any other suitable technique. Additionally or alternatively, in some implementations, the electromagnetic shielding structure 16 may be laminated on the mainboard 130 and electrically coupled with the ground of the mainboard 130. The electromagnetic shielding structure 16 may prevent radiation of at least some electromagnetic waves originated from the mainboard 130 as well as flow of external noise into the mainboard 130.

The electromagnetic shielding structure 16 includes a conductive bracket 161 and conductive rubber gaskets 162. The conductive bracket 161 includes a bottom part 1611, and wall parts 1612 protruding at a predetermined height from the bottom part 1611. The bottom part 1611 of the conductive bracket 161 is attached to the rear housing 115. The conductive rubber gaskets 162 of the electromagnetic shielding structure 16 are attached to top surfaces of the wall parts 1612 of the conductive bracket 161, and are electrically connected with the conductive bracket 161. The wall parts 1612 of the conductive bracket 161 are formed along the ground pad 133 on the mainboard 130. The top surfaces of the wall parts 1612 of the conductive bracket 161 are flat. Accordingly, when the conductive rubber gaskets 162 are attached to the top surfaces of the wall parts 1612 of the conductive bracket 161, an electrical contact is established between the conductive rubber gaskets 162 and the top surfaces of the wall parts 1612.

The conductive rubber gasket 162 is arranged between the mainboard 130 and the conductive bracket 161 and sends a flow of noise originated from the mainboard 130 to the conductive bracket 161. In some implementations, the conductive rubber gasket 162 can be an ElectroMagnetic Interference (EMI) gasket. In some implementations, the conductive bracket 161 can be molded from magnesium (Mg). Additionally or alternatively, in some implementations, the conductive bracket 161 may be omitted and the rubber gasket 162 may be coupled directly to the rear housing 115. In such implementations, a coating of zinc and/or conductive paints may be applied on the surface (or portions thereof) of the rear housing 115.

The mainboard 130 may include a substrate on which components of the device 100 are mounted. When the electromagnetic shielding structure 16 and the mainboard 130 are coupled with each other, a recess 1613 in the bottom part 1611 of the conductive bracket 161 accepts electronic part(s) 131 mounted on the mainboard 130 to decrease the distance between the electromagnetic shielding structure 16 and the mainboard 130. As shown, the conductive bracket may include a separate recess for each component (or group of components) that is mounted on the mainboard 130.

The mainboard 130 includes a ground pad 133 which is electrically connected with the ground of the mainboard 130. When the mainboard 130 and the electromagnetic shielding structure 16 are coupled with each other, the conductive rubber gasket 162 of the electromagnetic shielding structure 16 comes in elastic and electric contact with the ground pad 133 of the mainboard 130. Also, the mainboard 130 includes a mounting pad 132 for surface mounting the elastic members 17 and 18. The mounting pad 132 can be included in the ground pad 133, and may be electrically connected with the ground of the mainboard 130.

The conductive rubber gaskets 162 of the electromagnetic shielding structure 16 have grooves 1621 exposing the top surfaces of the wall parts 1612 of the conductive bracket 161. When the mainboard 130 and the electromagnetic shielding structure 16 are laminated and coupled with each other, spaces 1622 are formed by the grooves 1621 of the conductive rubber gaskets 162 and elastic members 17 and 18 are mounted on the mainboard 130 and arranged to fit in the spaces 1622. That is, the elastic members 17 and 18 are arranged not to overlap with the conductive rubber gaskets 162.

The elastic member 17 is arranged between the mainboard 130 and the conductive bracket 161 of the electromagnetic shielding structure 16 and sends a flow of noise originated from the mainboard 130 to the conductive bracket. The elastic member 17 includes a fixing fragment 171 and a free end 172. The fixing fragment 171 of the elastic member 17 is attached to a mounting pad 132 of the mainboard 130, via a conductive adhesive, a fastener (e.g., a screw), and/or any other suitable attachment means. Additionally or alternatively, the fixing fragment 171 of the elastic member 17 may be attached to the mounting pad 132 of the mainboard 130 using a surface mounting technology. The elastic member 17 is electrically connected with the ground of the mainboard 130. The free end 172 of the elastic member 17 is formed from the fixing fragment 171 by bending a portion of the fixing fragment as illustrated. The free end of the elastic member 17 may be elastic. When the conductive bracket 161 is coupled to the mainboard 130, the free end 172 of the elastic member 17 may be compressed against the conductive bracket 161 in a state being elastically supported from the fixing fragment 171. In some implementations, the portion of the elastic member 17 where the fixing fragment 171 and the free end 172 connect can be heat-treated to increase the restoration force of the free end 172.

In some aspects, because the conductive rubber gasket 162 is elastic, when an external impact on the device 100 occurs, the conductive rubber gasket 162 can compress, thereby permitting the conductive bracket 161 to get the close to the mainboard 130 and crush (or otherwise damage) the elastic member 17. In some aspects, when the elastic member 17 is crushed or otherwise damaged, the elastic force of the free end 172 may decrease, which in turn can cause a loss of contact between the free end 172 and the wall part 1612 of the conductive bracket 161. The loss of contact, in turn, can cause the noise shielding provided by the electromagnetic shielding structure 16 to deteriorate. To prevent such deterioration from happening, the elastic member 17 includes a protrusion 173 protruding from the fixing fragment 171. The protrusion 173 of the elastic member 17 prevents the conductive bracket 161 of the electromagnetic shielding structure 16 and the mainboard 130 from getting closer than a predetermined distance from one another. For example, when an external impact occurs (e.g., such as when the device 100 is dropped), the protrusion 173 acts as a buffer between the conductive bracket 161 and the mainboard 130, thereby preventing the conductive bracket 161 from crushing (or otherwise damaging) the free end 172 of the elastic member 17.

The elastic member 18 includes a fixing fragment 181, two free ends 182, and two protrusions 183. The fixing fragment 181 of the elastic member 18 can be attached to the mounting pad 132 of the mainboard 130 by a surface mounting technology, such that the elastic member 18 and the ground of the mainboard 130 are electrically connected with each other. The fixing fragment 181 of the elastic member 18 includes a holder part 184. A surface mounting apparatus may be used to safely mount the elastic member 18 on the mounting pad 132 of the mainboard 130 with catching the holder part 184 and then surface mounts the elastic member 18. The free ends 182 of the elastic member 18 are formed by bending portions of the fixing fragment 181 as illustrated. When the mainboard 130 and the conductive bracket 161 are coupled, the free ends 182 of the elastic member 18 can be compressed against the conductive bracket 161 by an external force in a state being elastically supported from the fixing fragment 181. The protrusions 183 of the elastic member 18 may have a round shape and face away from the fixing fragment 181. As illustrated, the protrusions 183 may be situated at different sides of the fixing fragment 181, respectively. The protrusions 183 may serve the same purpose as the protrusions 173.

As noted above, when the mainboard 130 and the electromagnetic shielding structure 16 are coupled with each other, the top surfaces of the wall parts 1612 press the free ends 172 and 182 of the elastic members 17 and 18, and the free ends 172 and 182 become biased toward the mainboard 130 while coming in elastic and electric contact with the top surfaces of the wall parts 1612. In this manner, the elastic members 17 and 18 become electrically connected with the mounting bracket 171.

In some aspects, the conductive bracket 161 of the electromagnetic shielding structure 16 may include at least one through-hole 1614. This through-hole 1614 may be used for screw coupling the mounting bracket 161 to the mainboard 130 and/or the rear housing 115.

Figure 6:
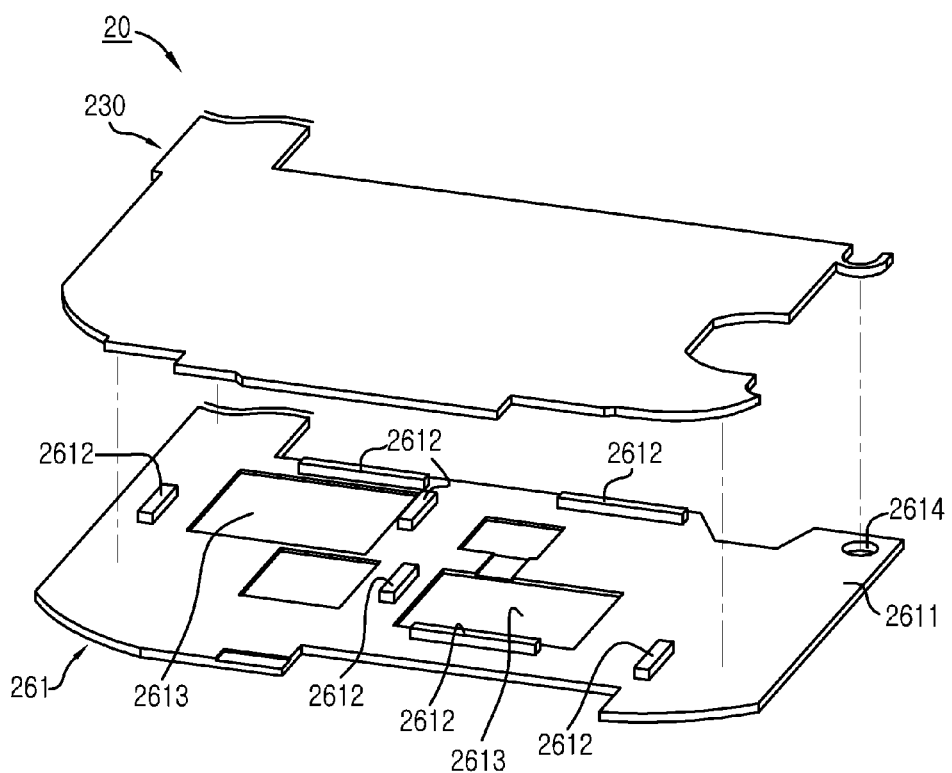
FIG. 6 is an exploded perspective view of portion(s) of an electronic device according to aspects of the disclosure.
Figure 7:
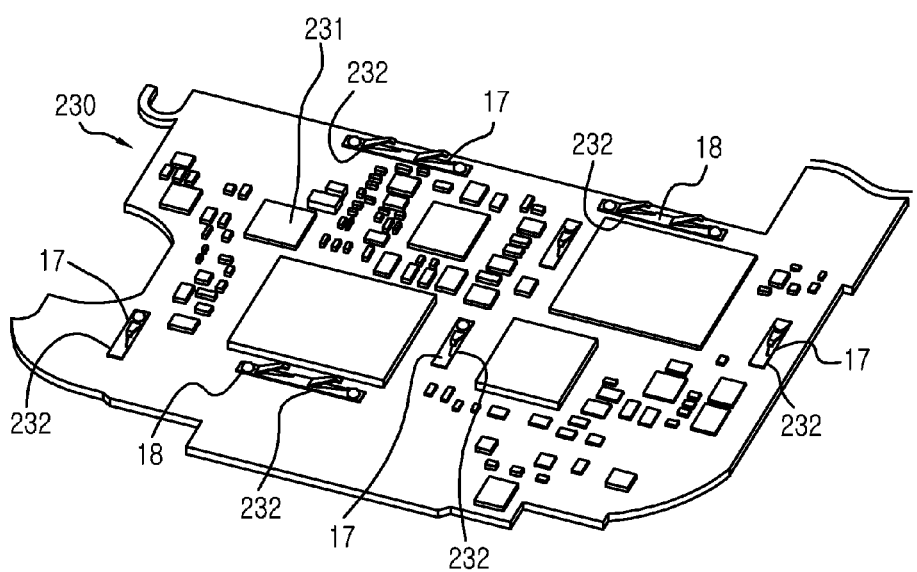
FIG. 7 is a perspective view of portion(s) of the electronic device of FIG. 6 according to aspects of the present disclosure.

Referring to FIGS. 6 and 7, shown is an electromagnetic shielding apparatus that includes a mainboard 230, and a conductive bracket 261 laminated and coupled to the mainboard 230. The conductive bracket 261 includes a bottom part 2611, and wall parts 2612 protruding at a predetermined height from suitable places of the bottom part 2611. The bottom part 2611 and the wall parts 2612 can be molded integrally. The bottom part 2611 of the conductive bracket 261 is fixed to a rear housing 215. The bottom part 2611 of the conductive bracket 261 includes at least one recess 2613. When the conductive bracket 261 and the mainboard 230 are coupled with each other, this recess 2613 may accept one or more of electronic parts 231 that are mounted on the mainboard 230 and, accordingly, decrease the distance between the conductive bracket 261 and the mainboard 230. The wall parts 2612 of the conductive bracket 261 are formed in places coming in contact with elastic members 17 and 18 that are mounted on the mainboard 230. In some implementations, the conductive bracket 261 includes at least one through-hole 2614. This through-hole 2614 may be used for screw coupling the conductive bracket 261 to the mainboard 230 and/or the rear housing 215.

The mainboard 230 may include a substrate on which electronic parts 231 are mounted. The mainboard 230 includes mounting pads 232 which electrically connected the elastic members 17 and 18 to the ground. In that regard, the elastic members 17 and 18 are surface mounted on the mounting pads 232 of the mainboard 230, and are electrically connected with the ground of the mainboard 230.

Figure 2:
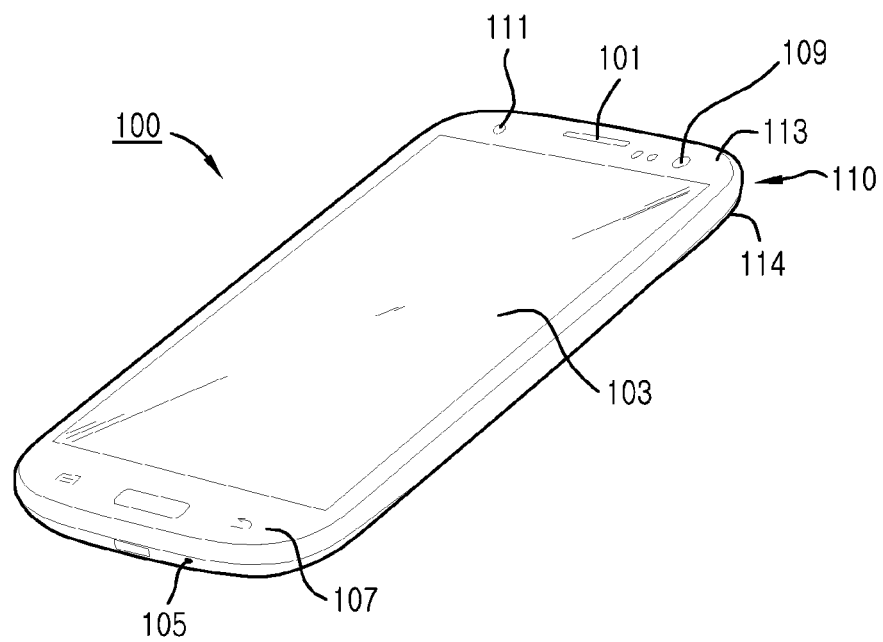
FIG. 2 is a perspective view of an electronic device according to aspects of the disclosure.
Figure 3:
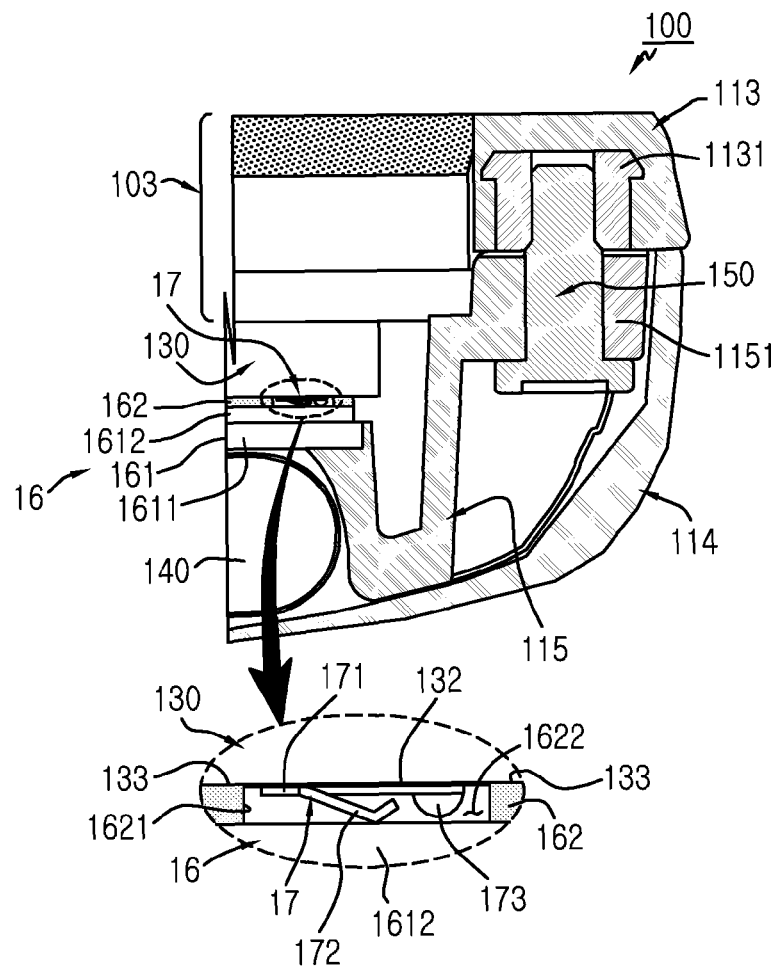
FIG. 3 is a cross-sectional view of portion(s) of the electronic device of FIG. 2 according to aspects of the disclosure.
Figure 4:
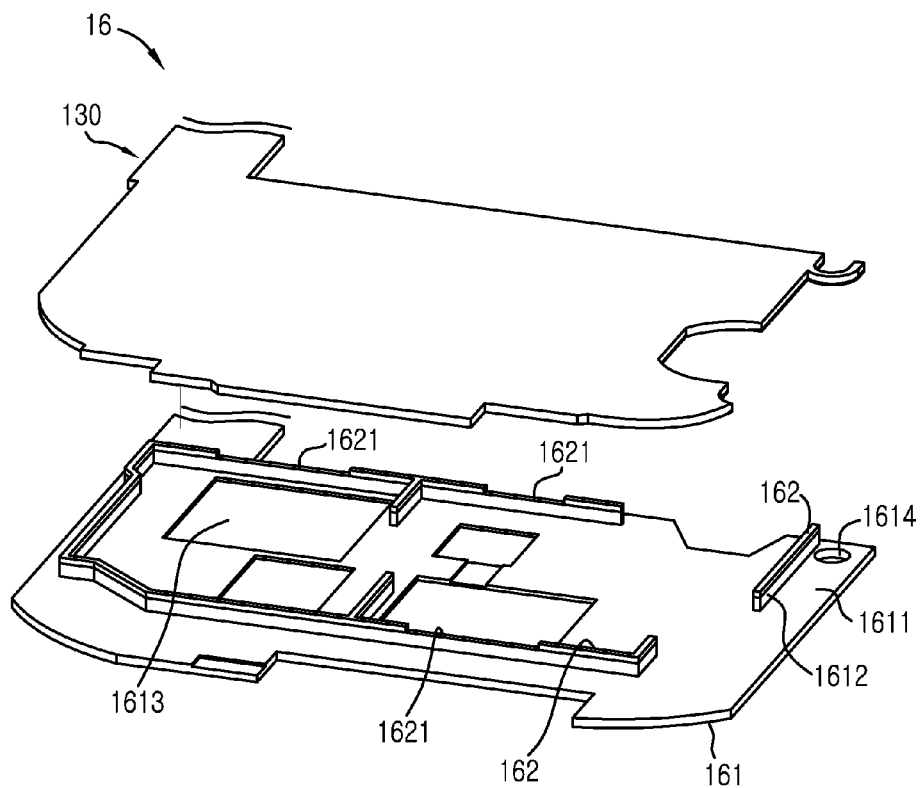
FIG. 4 is an exploded perspective view of portion(s) of the electronic device of FIG. 1 according to aspects of the disclosure.
Figure 5:
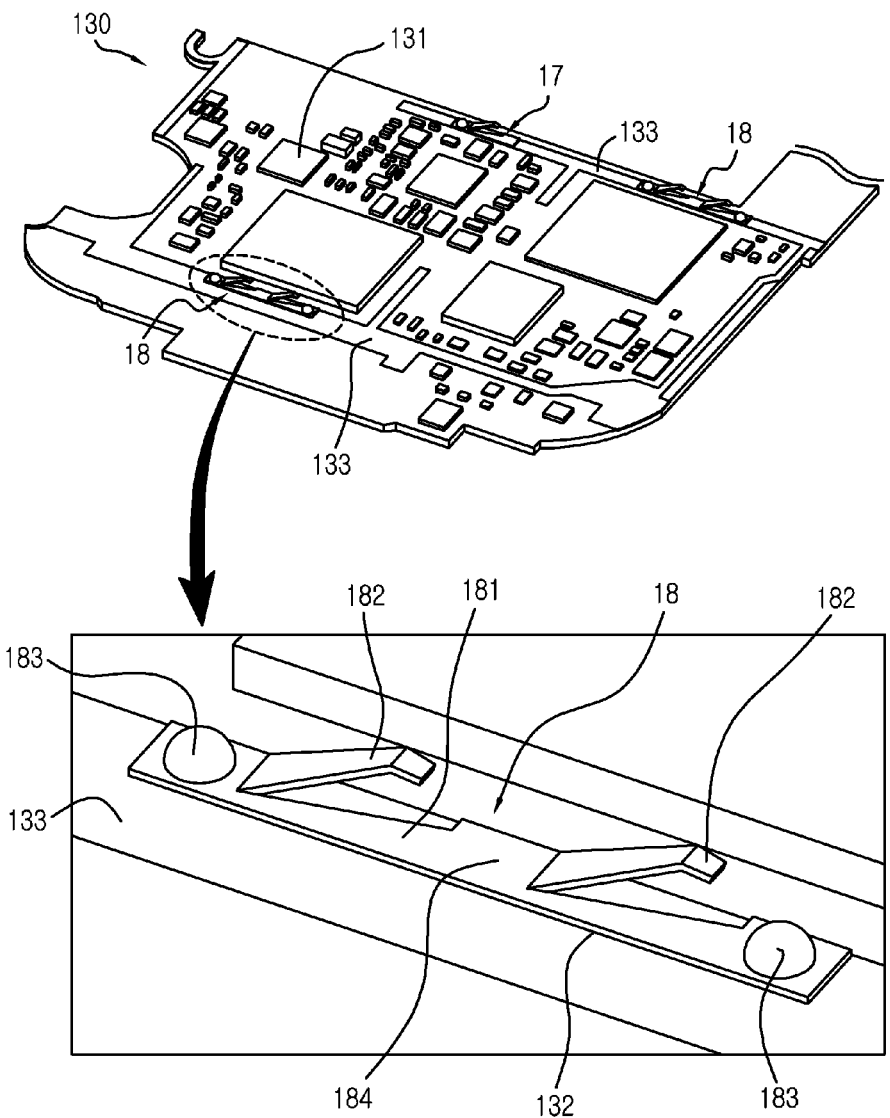
FIG. 5 is a perspective view of portion(s) of the electronic device of FIG. 2 according to aspects of the disclosure.
Figure 8A:
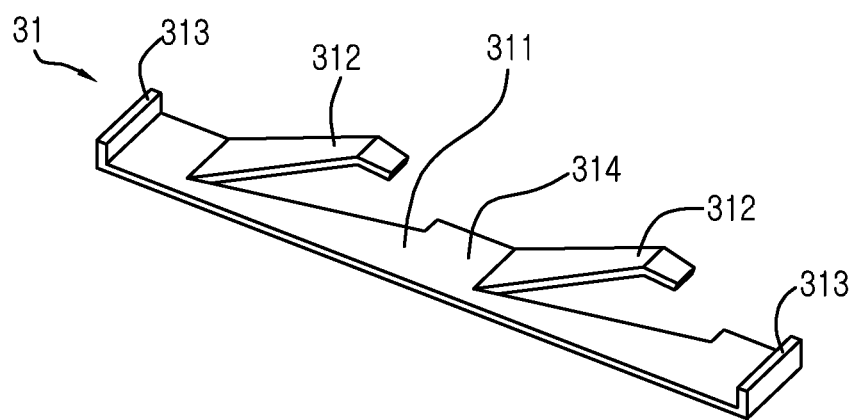
FIG. 8A, FIG. 8B, FIG. 8C, FIG. 8D, FIG. 8E, FIG. 8F and FIG. 8G are perspective views of elastic members that can be used to implement noise shielding in the electronic devices of FIGS. 2 and 6.

FIGS. 8A to 8G are perspective views of elastic members that can be used in the place of the elastic members 17 and/or 18 in the devices discussed with respect to FIGS. 2 and 6, according to aspects of the disclosure. Referring to FIG. 8A, shown is an elastic member 31 includes a fixing fragment 311, two free ends 312, and two protrusions 313. The fixing fragment 311 can be used to mount the elastic member on a mainboard (or elsewhere), discussed with respect to FIGS. 2-7. The free ends 312 of the elastic member 31 can be formed from the fixing fragment 311 by bending portions of the fixing fragment 311. The free ends 312 can extend away from the fixing fragment 311 and may be arranged at both sides of a holder part 314, respectively. The free ends 312 can be elastic. The protrusions 313 may extend away from the fixing fragment 311 in the same general direction as the free ends 312. As discussed above, the protrusions 313 may prevent the free ends 312 from being crushed, or otherwise damaged, when external force is applied against the elastic member 31. The protrusions 313 may be formed by bending the ends of the fixing fragment 311. The protrusions may have any suitable type of shape (e.g., a rectangular shape) and they may form any suitable angle with the fixing fragment 311 (e.g., a right angle).

Figure 8B:
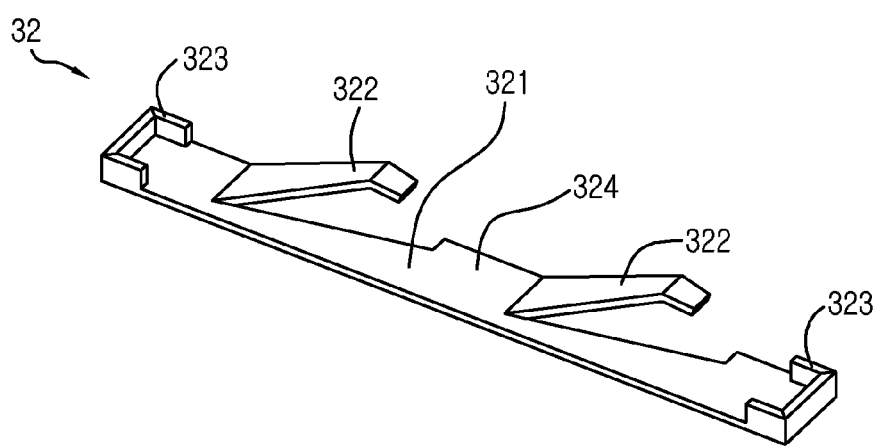

Referring to FIG. 8B, an elastic member 32 is shown having a fixing fragment 321, two free ends 322, and two protrusions 323. The fixing fragment 321 of the elastic member 32 can be used to mount the elastic member 32 on a mainboard (or elsewhere), discussed with respect to FIGS. 2-7. The free ends 322 of the elastic member 32 are formed from the fixing fragment 321 by bending portions of the fixing fragment 321. The free ends 322 extend away from the fixing fragment 321, as illustrated. The free ends 322 may be arranged at both sides of a holder part 324, respectively. The free ends 322 can be elastic. The protrusions 323 may extend away from the fixing fragment 321 in the same general direction as the free ends 322. As discussed above, the protrusions 323 may prevent the free ends 322 from being crushed, or otherwise damaged, when external force is applied against the elastic member 32. In this example, each protrusion may include three side walls. In some implementations, the side walls may be arranged at a right angle relative to one another and to the fixing fragment 321.

Figure 8C:
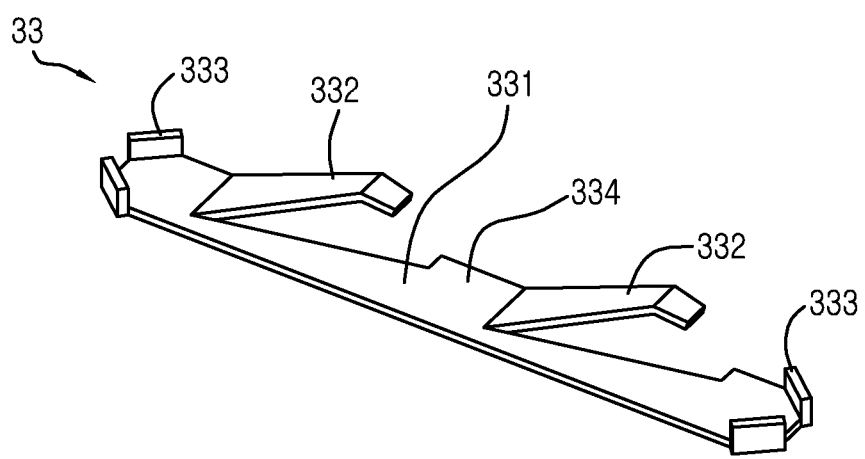

Referring to FIG. 8C, an elastic member 33 is shown having a fixing fragment 331, two free ends 332, and two protrusions 333. The fixing fragment 331 of the elastic member 33 can be used to mount the elastic member 33 on a mainboard (or elsewhere), as discussed with respect to FIGS. 2-7. The free ends 332 of the elastic member 33 may be formed by bending portions of the fixing fragment 331, as illustrated. The free ends may extend away from the fixing fragment. The free ends 332 may be arranged at both sides of a holder part 334, respectively. The free ends 332 can be elastic. The protrusions 333 may extend away from the fixing fragment 331 in the same general direction as the free ends 333. As discussed above, the protrusions 333 may prevent the free ends 332 from being crushed, or otherwise damaged, when external force is applied against the elastic member 33. In this example, each protrusion may be formed by bending and erecting one or more corners of the fixing fragment 331.

Figure 8D:
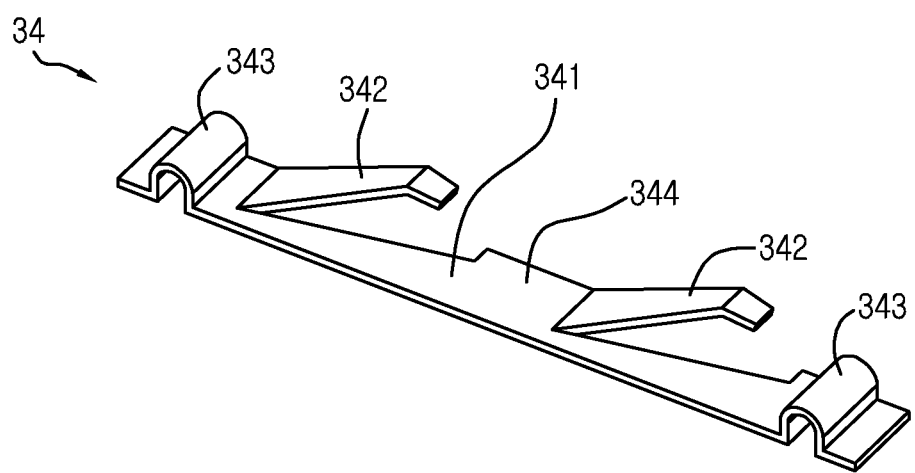

Referring to FIG. 8D, an elastic member 34 is shown having a fixing fragment 341, two free ends 342, and two protrusions 343. The fixing fragment 341 of the elastic member 34 can be used to mount the elastic member 34 on a mainboard (or elsewhere), discussed with respect to FIGS. 2-7. The free ends 342 of the elastic member 34 may be formed by bending portions of the fixing fragment 341, as illustrated. The free ends may extend away from the fixing fragment. The free ends 342 may be arranged at both sides of a holder part 344, respectively. The free ends 342 can be elastic. The protrusions 343 may extend away from the fixing fragment 341 in the same general direction as the free ends 343. As discussed above, the protrusions 343 may prevent the free ends 342 from being crushed, or otherwise damaged, when external force is applied against the elastic member 34. In this example, each protrusion may be formed by bending an interior portion of the fixing fragment 341 as shown.

Figure 8E:
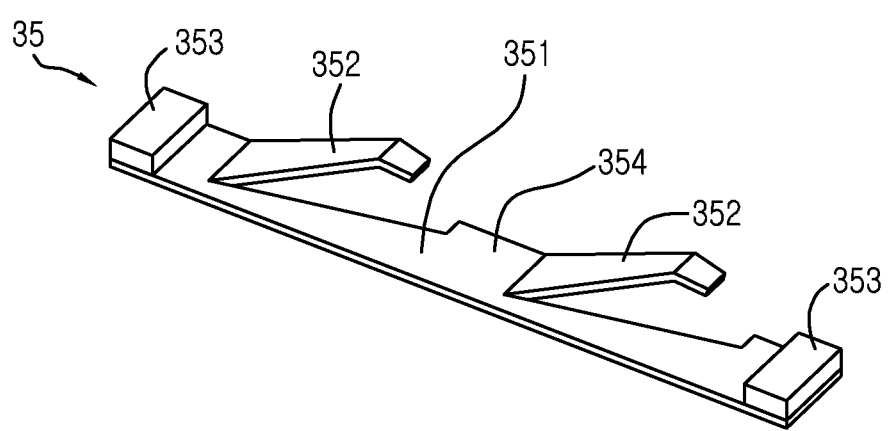

Referring to FIG. 8E, an elastic member 35 is shown having a fixing fragment 351, two free ends 352, and two protrusions 353. The fixing fragment 351 of the elastic member 35 can be used to mount the elastic member 33 on a mainboard (or elsewhere), discussed with respect to FIGS. 2-7. The free ends 352 of the elastic member 35 may be formed by bending portions of the fixing fragment 351, as illustrated. The free ends may extend away from the fixing fragment. The free ends 352 may be arranged at both sides of a holder part 354, respectively. The free ends 312 can be elastic. The protrusions 353 may extend away from the fixing fragment 351 in the same general direction as the free ends 353. As discussed above, the protrusions 333 may prevent the free ends 352 from being crushed, or otherwise damaged, when external force is applied against the elastic member 35. In this example, each protrusion 333 may be formed as a separate element that is coupled to the fixing fragment 351 via a bonding agent, or via any other suitable technique. Each protrusion may be made from metal, plastic, or any other suitable material.

Figure 8F:
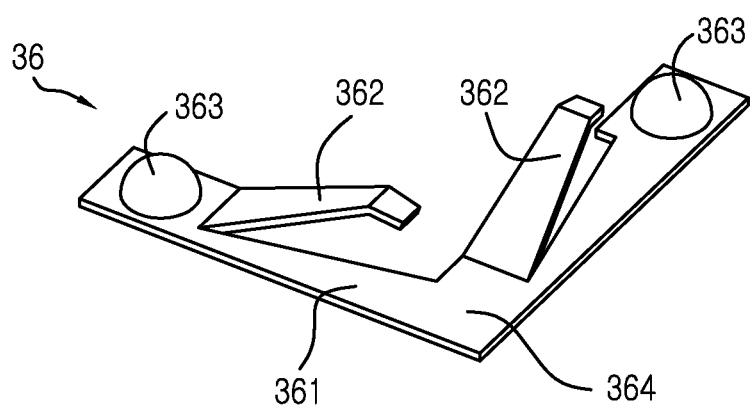

Referring to FIG. 8F, an elastic member 36 is shown having a fixing fragment 361, two free ends 362, and two protrusions 363. The fixing fragment 361 of the elastic member 36 can be used to mount the elastic member 36 on a mainboard (or elsewhere), discussed with respect to FIGS. 2-7. The fixing fragment, as illustrated, can have an angled shape. The free ends 362 of the elastic member 36 may be formed by bending portions of the fixing fragment 361, as illustrated. The free ends may extend away from the fixing fragment. The free ends 362 may be arranged at both sides of a holder part 364, respectively. The free ends 312 can be elastic. The protrusions 363 may extend away from the fixing fragment 361 in the same general direction as the free ends 363. As discussed above, the protrusions 363 may prevent the free ends 362 from being crushed, or otherwise damaged, when external force is applied against the elastic member 36. In this example, each protrusion 363 may have an oval shape.

Figure 8G:
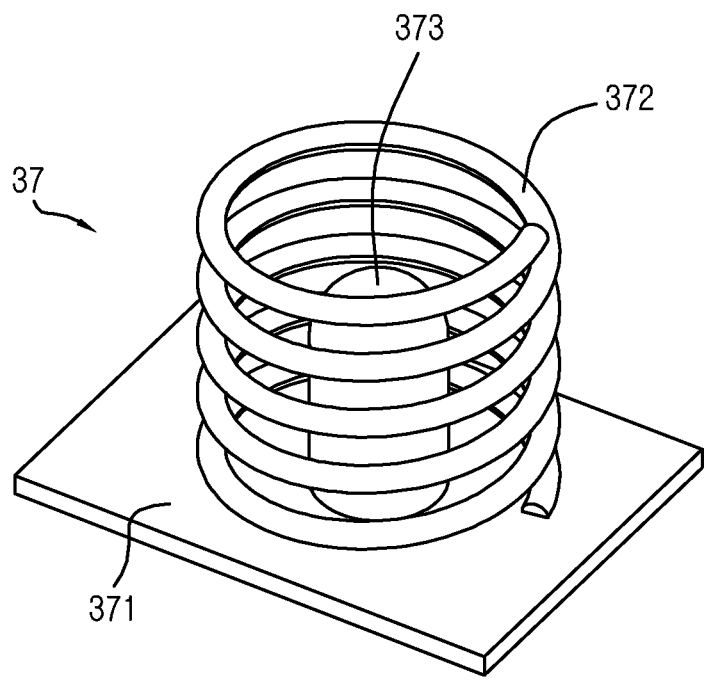

Referring to FIG. 8G, an elastic member 37 is shown having a fixing fragment 30 371, an elastic spring 372, and a protrusion 373. The fixing fragment 371 can be used to mount the elastic member on a mainboard (or elsewhere), as discussed with respect to FIGS. 2-6. The elastic spring 372 of the elastic member 37 may be coupled to the fixing fragment 371, such that it is electrically connected with the fixing fragment 371. The protrusion 373 of the elastic member 37 may be coupled to the fixing fragment 371 and may extend through the interior of the elastic spring 372, and is fixed to the fixing fragment 371. As discussed above, the protrusions 372 may prevent the elastic spring 372 from being crushed, or otherwise damaged, when external force is applied against the elastic member 37.

In view of the above examples, it should be noted that various different implementations of an elastic member may be used. In some instances, the elastic member may have any type of fixing fragment, such as a fixing fragment having a straight shape, a fixing fragment having an angled shape, a fixing fragment having a curved shape, etc. It should further be note that the elastic member may use any number of free ends, springs, or other elastic elements (e.g., 1, 2, etc.). Furthermore, it should be noted that free ends, springs, or other elastic elements can be located anywhere on the fixing fragment of the elastic member. It should further be noted that the elastic member may have any number, shape, or type of protrusions for preventing the free ends, springs, or other elastic elements from being crushed, or otherwise damaged. The protrusions may be located anywhere on the fixing fragment. It should further be noted that the conductive gaskets discussed herein can be made from rubber and/or any other suitable flexible material.

The apparatuses and methods of the disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. The functions and process steps herein may be performed automatically or wholly or partially in response to user command. An activity (including a step) performed automatically is performed in response to executable instruction or device operation without user direct initiation of the activity. No claim element herein is to be construed under the provisions of 35 U.S.C. 112, sixth paragraph, unless the element is expressly recited using the phrase "means for."

In short, while the disclosure has been presented with reference to certain preferred examples it will be understood by those skilled in the art that various changes in form and details may be made therein without departing from the spirit and scope of the invention as defined by the appended claims.

What is claimed is:

1. An electronic device comprising:
   a mainboard having a ground;
   a conductive bracket coupled to the mainboard; and
   an elastic member coupled to the mainboard, and electrically connected with the ground of the mainboard;
   wherein the elastic member is electrically connected to the conductive bracket;
   wherein the elastic member comprises:
      a fixing fragment attached to the mainboard;
      at least one free end formed from the fixing fragment protruding from the fixing fragment and being in elastic contact with the conductive bracket; and
      a means for stopping the mainboard and the conductive bracket from getting closer than a predetermined distance from one another includes at least one member attached to the fixing fragment and protruding from the fixing fragment;
   wherein the conductive bracket comprises:
      a bottom part;
      a wall part protruding from the bottom part, the wall part being in electrical contact with the elastic member; and
      a conductive flexible gasket arranged between the wall part of the conductive bracket and the mainboard.

2. The electronic device of claim 1, wherein the elastic member sends a noise originated in the mainboard to the conductive bracket.

3. The electronic device of claim 1, wherein the elastic member is mounted on the mainboard using a surface mounting technology.

4. The electronic device of claim 1, wherein the means for stopping the mainboard and the conductive bracket from getting closer than a predetermined distance from one another is formed by bending a portion of the fixing fragment towards the conductive bracket.

5. The electronic device of claim 1, wherein the elastic member includes an elastic spring.

6. The electronic device of claim 5, wherein the elastic member further comprises a protrusion passing through the elastic spring to prevent the mainboard and the conductive bracket from getting closer than a predetermined distance from one another.

7. The electronic device of claim 1, wherein the conductive bracket includes at least one recess configured to accept an electronic part that is mounted on the mainboard.

8. The electronic device of claim 1, wherein the conductive flexible gasket is configured not to overlap with the elastic member and is attached to the wall part of the conductive bracket.

9. The electronic device of claim 8, wherein the mainboard includes a ground pad coming in electrical contact with the conductive flexible gasket, the ground pad being electrically connected with the ground of the mainboard.

10. The electronic device of claim 1, wherein the conductive bracket is formed by a housing of the electronic device.

11. The electronic device of claim 1, wherein the conductive bracket is molded from magnesium (Mg).

12. The electronic device of claim 1, wherein the mainboard and the conductive bracket are coupled by at least one fastener.

13. The electronic device of claim 1, wherein the mainboard and the conductive bracket are laminated.

14. The electronic device of claim 1, further comprising a housing configured to receive the mainboard and the conductive bracket.

* * * * *